US005260669A

United States Patent [19]

Higgins et al.

[11] Patent Number: 5,260,669

[45] Date of Patent: Nov. 9, 1993

[54] CIRCUIT FOR GENERATING FIRST AND SECOND IN-PHASE ALTERNATING SIGNALS

[75] Inventors: Alton N. Higgins, Bedford; Henry L. Beaty, Lawrenceville, both of Ga.

[73] Assignee: Lectro Products, Inc., Athens, Ga.

[21] Appl. No.: 828,139

[22] Filed: Jan. 30, 1992

Related U.S. Application Data

[62] Division of Ser. No. 581,272, Sep. 12, 1990.

[51] Int. Cl.$^5$ .......................... H03K 9/06; H03K 5/13

[52] U.S. Cl. ...................................... 328/133; 328/155

[58] Field of Search ........................ 328/133, 134, 155

[56] References Cited

U.S. PATENT DOCUMENTS 4,215,280 7/1980 Mahig ................................ 328/138

*Primary Examiner*—Jin F. Ng
*Assistant Examiner*—Sinh Tran
*Attorney, Agent, or Firm*—Wallenstein, Wagner & Hattis, Ltd.

[57] ABSTRACT

A device for providing an orderly shut-down of a system of interconnected traffic lights upon loss of its primary electrical power is disclosed. A device for permitting consistent reapplication of power to a line conditioner having a ferroresonant transformer is also disclosed. Further, a battery charger for charging a battery system including a plurality of battery cells coupled in series is disclosed. Additionally, a device for determining proper operation of a power transistor by monitoring its saturation voltage and emitter current is also disclosed. Finally, a device for generating a first alternating signal in-phase with a separately generated second alternating signal is disclosed.

4 Claims, 6 Drawing Sheets

CIRCUIT FOR GENERATING FIRST AND SECOND IN-PHASE ALTERNATING SIGNALS

This is a divisional of copending application Ser. No. 07/581,272, filed on Sep. 12, 1990.

TECHNICAL FIELD

Applicants' invention relates to devices for controlling a system of traffic signals at an intersection, and more particularly, to a device which is forgiving of line power fluctuations and short term interruptions and which provides for an orderly shutdown of the traffic signals upon relatively longer term line power interruptions.

BACKGROUND PRIOR ART

Modern traffic control signals, or traffic lights, are commonly controlled by a computer based controller. Because the controller typically receives its power from a utility line, the controller is subjected to power abnormalities such as voltage spikes, voltage fluctuations as well as outright power failures, which can cause the controller to fail and lead to a complete shut down of the traffic lights. Thus a system is needed which filters voltage spikes and voltage fluctuations and provides backup power in the event of a power failure.

While controller failures have been proposed which initiate an alarm upon detection of a problem, this is often too late and can also be very dangerous. For example, if two or more cars are approaching an intersection from different directions, and the traffic lights suddenly go out, the approaching cars would not know who had the right-of-way and could crash. Thus a system is needed which provides for an orderly shut down of the traffic lights upon loss of power.

Various systems have been proposed for providing computers with back-up power, such as can be provided by a bank of batteries coupled in series and an invertor. Such systems often include battery chargers for charging the bank of batteries to a predetermined float voltage, the float voltage being determined by the sum of the voltages of the batteries. However, if one, or more, of the batteries, or cells thereof, are defective and, hence, effectively a short, the total voltage across the bank of batteries will never reach the float voltage to shutoff the battery charger, resulting in a damaging overcharging of the remaining good batteries.

Further, when the utility power returns, it is necessary for the controller to transparently switch from the back up power to the utility power, i.e., the output of the invertor must be in-phase with the utility power.

Still further, systems often shut down when the line voltage is determined to be too low. However, utility lines often have relatively high impedance, and line conditioners to condition utility power often are highly inductive. The high inductance results in a large inrush of current upon a restart of the controller, and this large inrush current traveling through the high impedance utility line results in a short term voltage drop which can trick the system into shutting down.

Finally, inverters typically include power transistors, such as Darlington transistors. To monitor the condition of a load coupled to the invertor, devices have been proposed which monitor the current through the power transistors when conducting. This, however does not always provide an accurate indication of the condition of the load.

Applicants' invention is provided to solve these and other problems.

SUMMARY OF THE INVENTION

It is one object of the invention to provide a device for providing an orderly shut-down of a system of interconnected traffic lights upon loss of its primary electrical power.

In accordance with the invention, the system includes a reserve source of electrical power and a traffic controller. The traffic controller provides traffic control signals to selectively illuminate the traffic lights in either of a normal operating mode or a flashing mode.

The device comprises means for detecting loss of the primary electrical power, means responsive to the primary power loss detecting means for switching the device from the primary source of electrical power to the reserve source of electrical power, means for determining when the traffic controller has placed the traffic lights in a safe condition and means responsive to the primary power loss detecting means and the safe condition determining means for commanding the traffic controller to transfer the traffic lights from the normal operating mode to the flashing mode.

The device further includes means for determining when the reserve source of power has diminished to a level and means responsive to the determining means for commanding the traffic controller to turn off the traffic lights.

The device still further includes means for determining that the traffic lights have operated in the flashing mode for a time interval and means responsive to the time interval determining means for commanding the traffic controller to turn off the traffic lights.

The device yet further includes means for detecting return of the primary electrical power and means responsive to the primary power return detecting means for switching the device from the reserve source of electrical power to the primary source of electrical power. The reserve power switching means includes means for switching the device from the reserve source of electrical power to the primary source of electrical power when the reserve power is in phase with the primary power.

It is a further object of the invention to provide an apparatus for permitting consistent reapplication of power to a line conditioner having a ferroresonant transformer.

In accordance with the invention, the ferro-resonant transformer includes an input terminal coupled to an input winding and an output terminal coupled to an output winding, and means coupled to the output terminal for generating a low line voltage signal in response to a low line voltage condition at the output terminal. The apparatus includes means for detecting reapplication of power to the input terminal and means for disabling the low line voltage signal for a period of time following the reapplication of power.

It is yet a further object of the invention to provide a battery charger for charging a battery system, the battery system including a plurality of battery cells coupled in series.

In accordance with this aspect of the invention, the battery charger comprises means for charging the plurality of battery cells over time at a first charging current, means for measuring the voltage across the plurality of battery cells, means responsive to the voltage measuring means for determining when the measured voltage equals a float voltage, means for measuring an elapsed time of charging the plurality of battery cells at the first charging rate, means responsive to the time measuring means for determining when the plurality of battery cells have been charged at said first charging level for a time interval, and means responsive to the voltage determining means and the time interval determining means for charging the plurality of battery cells at a second, lesser, charging rate when either the measured voltage equals the float voltage or the determined time equals the time interval. The battery charger includes an alarm and means responsive to time measuring means for triggering the alarm.

It is still an other object of the invention to provide a device for determining proper operation of a power transistor, the switching transistor having first and second power electrodes and a control electrode and being cyclically turned on and off upon a cyclical application of a drive signal to the control electrode.

In accordance with this aspect of the invention, the device comprises means for detecting the presence of the drive signal to the control electrode, means for measuring the voltage across the power electrodes upon detection of the control signal, and means for terminating the drive signal for the cycle when the measured voltage exceeds a voltage level, such as an excessive collector-emitter saturation voltage.

It is also an object of the invention to provide a device for generating a first alternating signal in-phase with a separately generated second alternating signal.

In accordance with this aspect of the invention, the device comprises means for generating a primary alternating signal at a frequency substantially equal to the frequency of the first alternating signal and means for generating upper and lower alternating signals, the upper alternating signal at a frequency greater than the frequency of the primary alternating signal and the lower alternating signal at a frequency less than the frequency of the primary alternating signal. The device further includes means for comparing the phase angle of the first alternating signal with the phase angle of the second alternating signal; and means for generating the first alternating signal, the generating means comprising means for selectively passing the primary alternating signal when the phase angle of the first alternating signal equals the phase angle of the second alternating signal, for selectively passing the upper alternating signal when the phase angle of the first alternating signal lags the phase angle of the second alternating signal and for selectively passing the lower alternating signal when the phase angle of the first alternating signal leads the phase angle of the second alternating signal.

Other features and advantages of the invention will be apparent from the following specification taken in conjunction with the following drawings.

DETAILED DESCRIPTION

Figure 1:
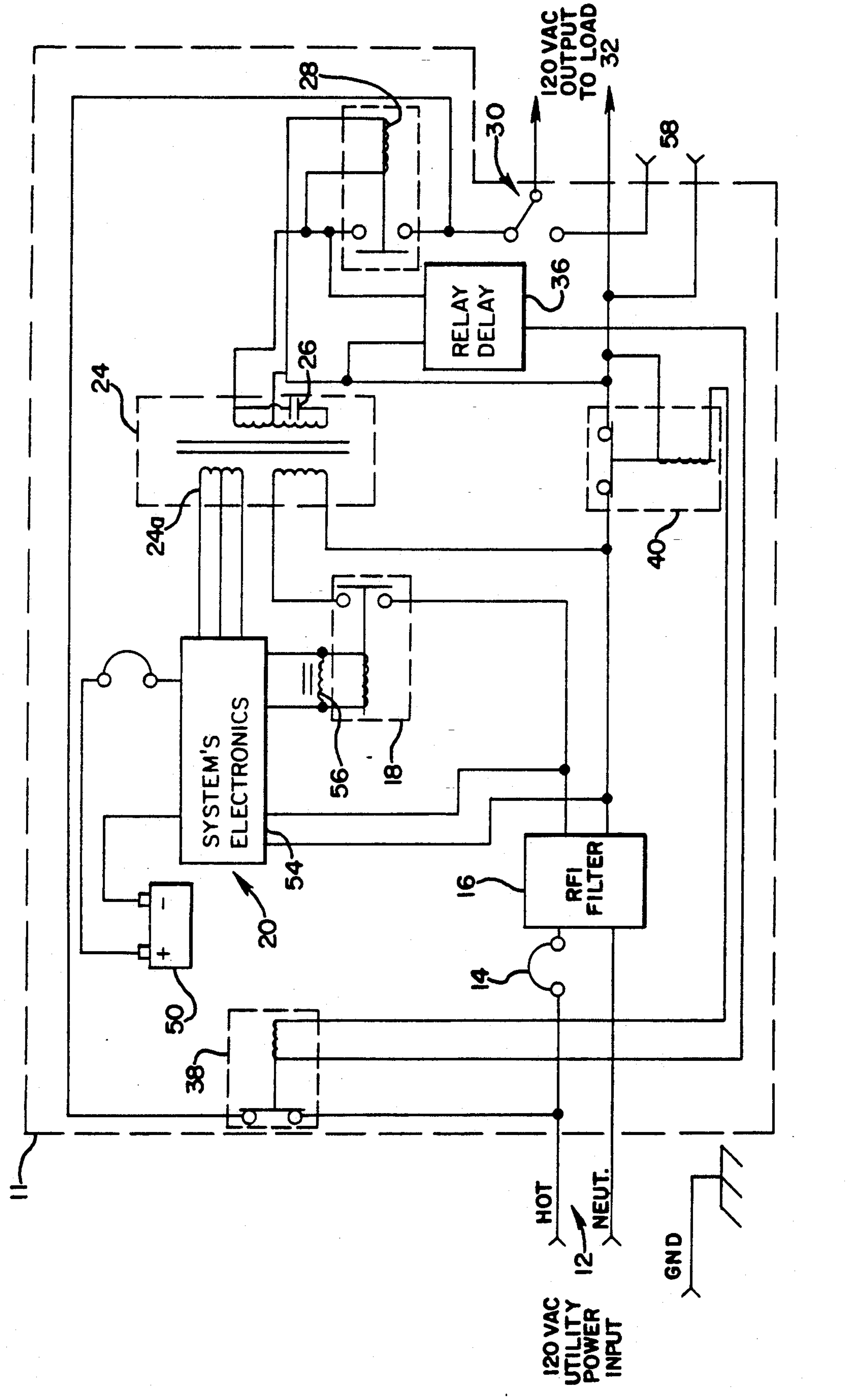
FIG. 1 is a generalized block diagram of the apparatus of applicants' system.

While this invention is susceptible of embodiments in many different forms, there is shown in the drawings and will herein be described in detail, a preferred embodiment of the invention with the understanding that the present disclosure is to be considered as an exemplification of the principles of the invention and is not intended to limit the broad aspects of the invention to the particular embodiment illustrated.

A block diagram of applicants system, generally designated 10, housed within a cabinet 11, is illustrated in FIG. 1. As will be discussed in greater detail below, the system 10 conditions utility power provided to a traffic light controller (not shown). The system provides the controller with proper information regarding the status of the power to provide for an orderly shut down of the traffic lights upon failure of the utility power. The system 10 further provides a battery backup to provide short term power via an invertor to the controller upon failure of the utility power. Additionally, the system 10 provides a means for reconnecting the controller to the utility power and for recharging the batteries upon return of the utility power.

Utility input power is provided over utility lines 12 via a line circuit breaker 14 to an radio frequency interference, or RFI, filter 16. The output of the RFI filter 16 is coupled to a normally open relay 18. The RFI filter 16 prevents line noise from disturbing a line sense input to the system's electronics, generally designated 20, discussed below.

If the electronics 20 detect adequate and stable utility line voltage, the relay 18 is closed, energizing a ferroresonant, or FR, transformer 24. The FR transformer 24 provides a regulated voltage output by employing special gaps in its core, combined with an energy storing resonating winding which cooperates with an external capacitor module 26. This resonating winding arrangement provides a sine wave output instead of the quasisine wave characteristic of most FR transformers. The FR transformer 24 further includes aluminum plates (not shown) within the stack that provide mounting capability and efficiently conducts heat away from the core of the FR transformer 24 to the cabinet 11. The capacitor module 26 contains three hermetically sealed capacitors, wired in parallel.

Output from the secondary of the FR transformer 24 energizes a normally open, relay 28, providing output voltage through a generator switch 30, to a load, generally designated 32.

Output from the secondary of the FR transformer 24 also provides a delayed DC output from a relay delay circuit 36 which energizes and opens normally closed, relays 38, 40, providing complete isolation of the load 32 via the FR transformer 24.

The relays are arranged such that in the event of a failure of the system 10, output from the secondary of the FR transformer would cease, causing the second relay 28 to open and the third and fourth relays 38, 40 to close, connecting the load 32 directly to the utility lines 12.

As discussed in greater detail below, the relay delay circuit 36 provides a short delay in energizing relays 28, 38 to insure that upon initial system power up, the output of the FR transformer 24 is stable before connecting the FR transformer 24 to the load 32. The relay delay circuit 36 similarly provides a short delay before reconnecting the load 32 to the utility lines 12 in the event of a system failure, to insure that a failure has indeed occurred. The relay delay circuit 36 is mounted on a relay delay board (not shown) which contains additional circuitry to convert AC power from the secondary of the FR transformer 24 into DC power to operate the third and forth relays 38,40.

If required by local codes, the system 10 includes a neutral output line (not shown) which may be connected to the utility neutral or, if the utility neutral is grounded, the system's neutral output line may also be connected to ground.

The electronics module 20 includes a power module 44 and a control module 46. The power module 44 contains an inverter 48 and associated circuits, and the control module 46 contains a battery charger and logic circuit, as discussed below. A 48 volt battery 50 cooperates with the inverter 48 to provide standby power. The battery 50 is actually four, twelve volt rechargeable batteries wired in series. The electronics module 20 includes a line voltage sense input 54 which monitors the utility line voltage. In the event of a power "brown-out" or total failure of the utility power as sensed by the line voltage sense input 54, the electronics 20 starts the inverter 48 in approximately 5 milliseconds, and opens the relay 18, preventing the FR transformer 24 from feeding the standby power back into the utility lines 12. The standby power also closes a fifth relay 56 (coil only shown), turning on a cooling fan (not shown) to cool the inverter 48. When the utility power is later reapplied, and after a programmed delay to insure utility voltage stability and synchronized inverter/line frequency, discussed below, the inverter 48 is turned off, closing the first relay 18, and operating the FR transformer 24 from the utility power.

The FR transformer 24 includes an inverter winding 24*a* which serves two purposes. First, when operating from utility power, the inverter winding 24*a* provides power for recharging the battery 50. Second, when operating from standby power, the inverter winding 24*a* acts as a push-pull primary winding for the input of the generally square-wave power developed by the inverter 48. The FR transformer 24 in conjunction with the capacitor module 26 converts this square-wave power to a sine wave output.

The system 10 includes a generator input 58 to receive power from an external generator (not shown) during extended utility power interruptions. With the generator coupled to the generator input 58 and the generator switch 30 set to the down position, as viewed in FIG. 1, the load 32 will be transferred to the generator.

Figure 2:
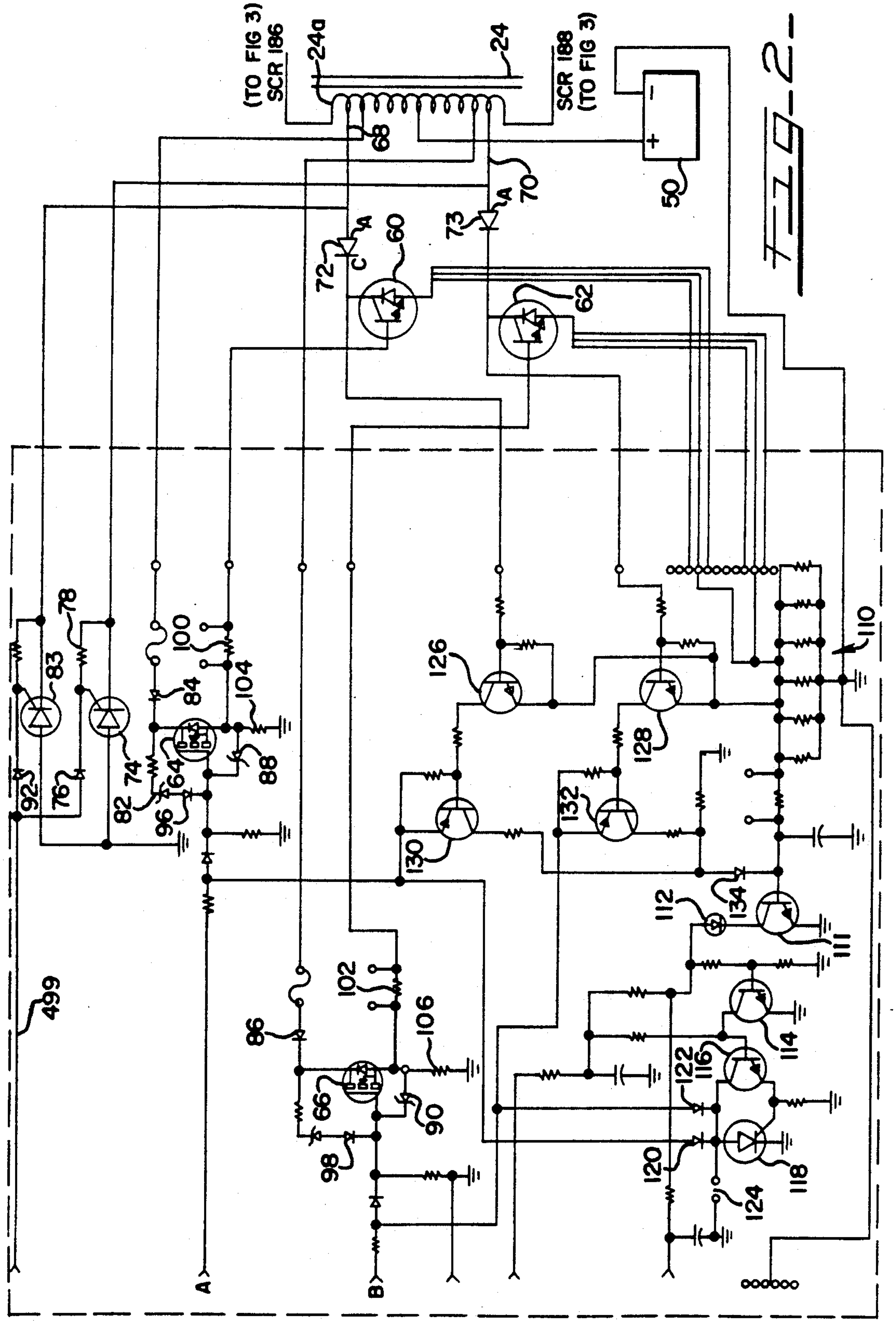
FIG. 2 is a schematic diagram of the inverter and related components of applicants' system.

The inverter 48 and related components for operating the system 10 from the batteries 50 are illustrated in FIG. 2.

The inverter 48 includes first and second high voltage, high current, NPN Darlington power transistors, 60, 62, which provide switched current paths for each respective half of the FR transformer 24 to the circuit common, which in the instant case is the negative pole of the battery 50. The centertap T of the inverter winding 24*a* is connected to the positive pole of the battery 50.

As discussed in greater detail below, the control module 46 generates a pair of square wave drive signals which appear as two, 60 Hz, out of phase signals at inputs A and B, respectively. The square wave drive signals, when high, turn on respective first and second, enhancement mode FET transistors 64, 66. The first and second FET transistors 64, 66 turn on the respective power transistors 60, 62. Drive current for the first and second power transistors 60, 62 is passed through the first and second FET transistors 64, 66, to respective pre-drive taps 68, 70 on the FR transformer 24, which provides the necessary drive voltage.

Assume an initial condition of the power transistor 60 being on (conducting), and the power transistor 62 being off. At the start of the next cycle of the square wave drive signals, the power transistor 60 will switch off, and a very short time later, the second power transistor 62 will switch on. As soon as the power transistor 60 switches off, a positive voltage spike appears at its collector C due to the inductive kick of the FR transformer 24. Correspondingly, a negative voltage spike appears at the anode A of a diode 72.

In order to absorb this positive voltage spike, the negative spike at the anode A of a diode 73 is shunted to ground and then back through the battery 50 to the center tap T of the inverter winding 24*a* of the FR transformer 24. This is accomplished by turning on a snubber SCR 74, causing current to flow through a diode 76 and a resistor 78. Thus, as soon as the negative spike at the cathode of the SCR 74 drives it slightly below the circuit common, the SCR 74 will latch on for as long as the negative spike causes current to flow. through the SCR 74.

Simultaneously, the rapidly increasing positive spike at the anode A of the diode 72, and correspondingly, the collector of the power transistor 60, also appears at drain of the FET transistor 64. When this voltage exceeds 150 volts, a zener diode 82 conducts, turning the first FET transistor 64 back on, which in turn causes the power transistor 60 to conduct until the positive spike voltage drops back below 150 volts.

Thus the SCR 74 passes the negative inductive spike from the bottom part of the inverter winding 24*a* of the FR transformer 24, while the zener diode 82 causes the FET transistor 64 to conduct and the power transistor 60 to absorb the positive spike from the upper part of the inverter winding 24*a* of the FR transformer 24, thus protecting the power components from over-voltage. Corresponding components, including a second snubber SCR 83, operate similarly for the alternate cycle.

Diodes 84, 86 respectively protect the FET transistor 64 and the FET transistor 66 from any negative voltage on the pre-drive lines, while zener diodes 88, 90 protect the gates of the FET transistor 64 and the FET transistor 66 from excessive voltage. Diodes 92, 76 prevent high positive spikes from the FR transformer 24 from feeding back into the control module 46. Diodes 96, 98 isolate respective FET drives of the FET transistors 64, 66 from their respective collectors, so as not to short out the FET drives when the FET transistors 64, 66 conduct.

Resistors 100, 102 provide current limiting for the drive to the power transistors 60, 62, while resistors 104, 106 provide protection for the FET transistors 64, 66. The diodes 72, 73 prevent reverse voltage from appearing on the power transistors 60, 62 when recharging the battery 50. The power transistors 60, 62 can withstand normal positive voltages, as they will be switched off when recharging the battery 50.

The emitters of the power transistors 60, 62 are tied together and then to circuit common through a string of parallel power resistors, generally designated 110. The power resistors 110 provide a voltage proportional to the current through the power transistors 60, 62. This proportional voltage is applied to the base of a transistor 111. If this voltage at the base of the transistor 111 exceeds approximately 0.6 volts, corresponding to an overload current of approximately 180 amperes through the power transistors 60, 62, the transistor 111 will conduct, turning on an overload indicator 112. Correspondingly, a transistor 114 will turn off, and a transistor 116 will turn on, which then turns on an SCR 118. When the SCR 118 conducts, the respective square wave drive signals at inputs A and B are shorted to circuit common by respective diodes 120 and 122. This turns off the power transistors 60, 62, effectively shortening or interrupting the duty cycle of the square wave drive signal and dropping the current through the FR transformer 24 to zero, thus providing over-current protection.

The power module 44 includes a heat sink plate (not shown) and a temperature sensor 124 comprising a normally open, bi-metal thermostat, is mounted thereon. If the sensed temperature becomes excessive, the sensor 124 closes, duplicating the action of the SCR 118 in shunting the input drive to protect the components from over-temperature.

Finally, the collector-to-emitter saturation voltage of the power transistors 60, 62 are respectively sensed by transistors 126, 128 which, when conducting, respectively turn on transistors 130, 132. The transistors 130, 132 will conduct only when their respective square wave emitters are high, indicating a respective square wave drive input, thus gating the respective transistor pairs 130, 126 and 132, 128 in-phase with their respective drive signals.

In the event that the transistors 130, 132 conduct, indicating excessive collector/emitter saturation voltage across the power transistors 60, 62, respectively, a diode 134 will conduct, turning on the transistor 111, again shunting the respective drive signal to protect the power transistors 60, 62. The input to the transistor 111 is effectively an OR signal, specifically current overload OR saturation voltage overload. Also due to a short "dead" time between respective input drive square wave signals, the SCR 118 will latch on for each cycle of over-current or over-saturation voltage, but will then return to a non-conducting state at the end of each cycle, when the drive voltage momentarily goes to zero. Thus the system 10 will continue to try to operate, being automatically reset for each drive cycle. In the event that the overload self-corrects, or is only momentary, the system 10 will resume normal operation on the next cycle.

Figure 3A:
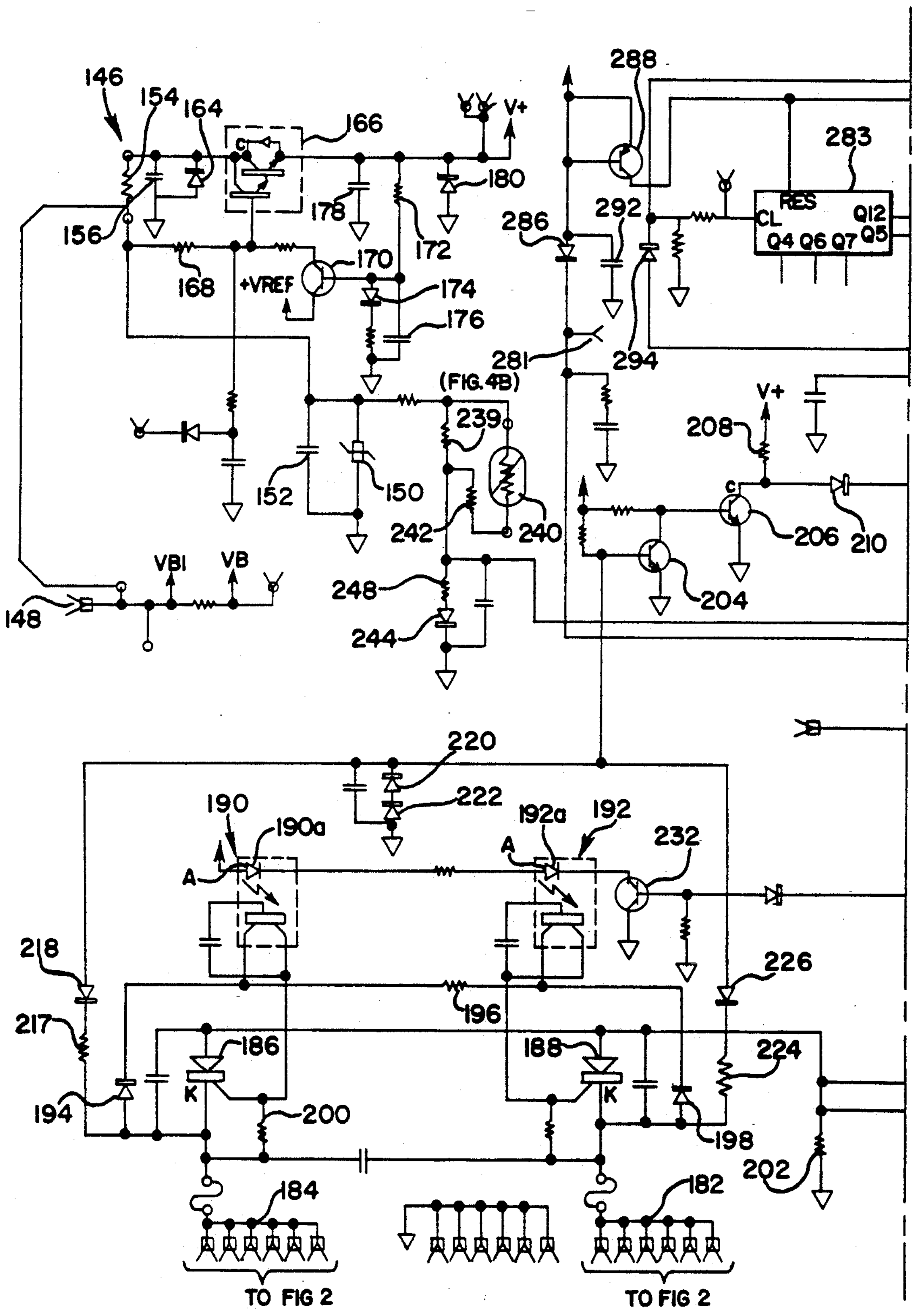
FIG. 3 is a schematic diagram of one of the control modules including battery charger circuitry of applicants system.
Figure 3B:
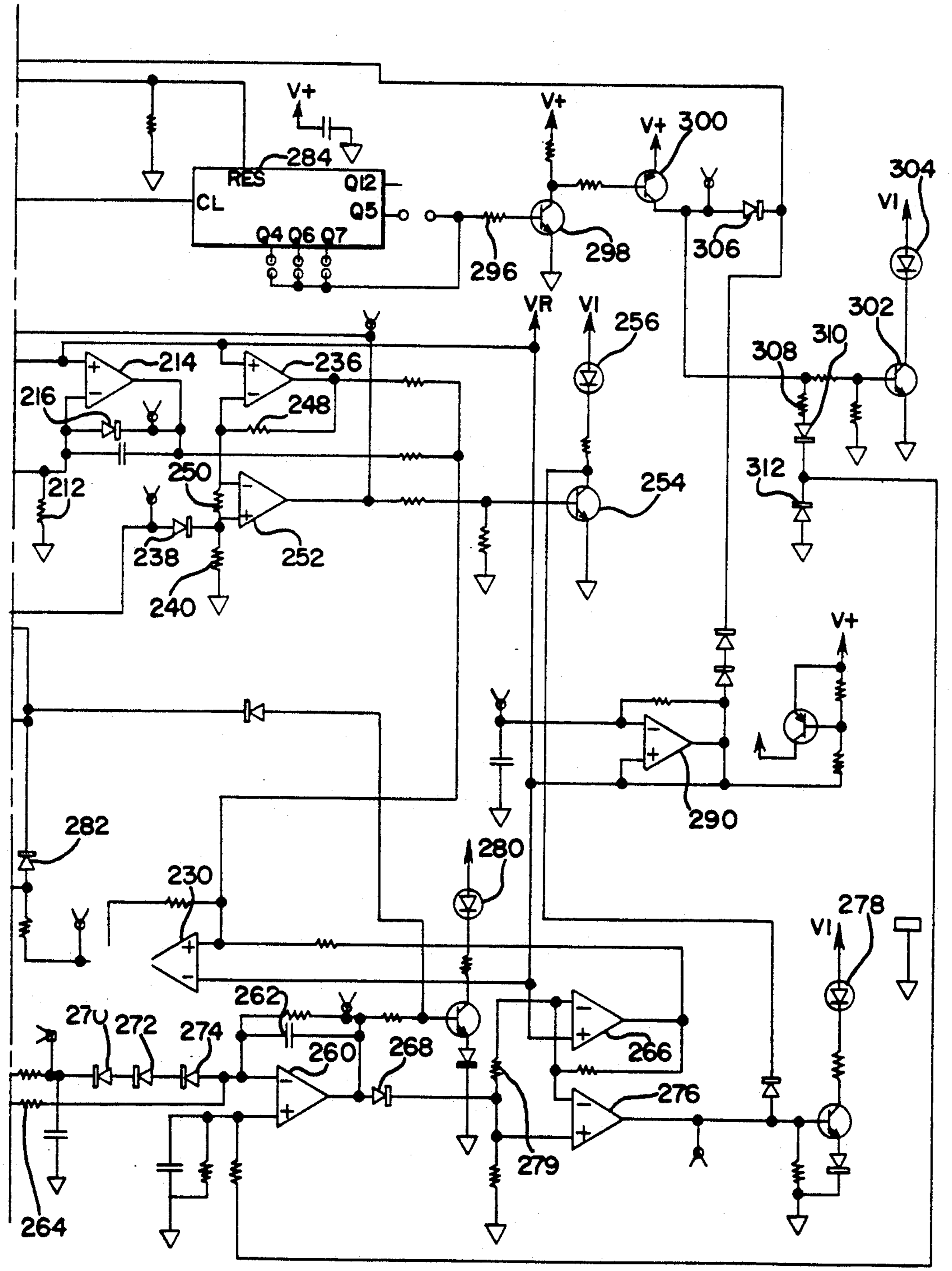

One portion of the control module 46 is illustrated in FIG. 3. The control module 46 contains circuitry for the battery charger, internal battery power supply and control logic circuits.

The 48 VDC battery voltage is applied to a power supply part of the circuitry, generally designated 146, by a pin 148, of a card edge connector (not shown), where it is reduced to 14 VDC for component use. Other pins connect the circuits to the system common.

Battery voltage at the pin 148 is spike protected by a varistor 150, filtered by a capacitor 152 and current limited by a resistor 154 with final filtering by a capacitor 156 and over-voltage protection by a diode 164. The resulting voltage is provided to a collector C of a Darlington power regulation transistor 166.

Drive current for the power regulation transistor 166 is provided through a resistor 168 which is coupled to the positive pole of the battery 50. A shunt transistor 170 operates as a regulating shunt path for the drive current to the regulation transistor 166. As the voltage on the emitter of the regulation transistor 166 increases, it is sensed by the shunt transistor 170 at the junction of a resistor 172 and a diode 174. A capacitor 176 acts as a bypass filter, and the diode 174 provides temperature compensation for the emitter-base junction of the shunt transistor 170. Should the base voltage of the shunt transistor 170 exceed the 5 volt reference voltage at the emitter of the shunt transistor 170, the shunt transistor 170 will conduct proportionally to regulate the voltage at the emitter of the regulation transistor 166 to approximately +14 volts, DC.

A capacitor 178 provides final filter for the power voltage, with a diode 180 providing an overvoltage clamp action.

Charging voltage from one end of the inverter winding **24*a* of the FR transformer 24 is applied respectively to card pins generally designated 182 and from the other end thereof by card pins generally designated 184. The voltage at either of the pin 182 or the pin 184 is collectively referred to as the AC board input. SCR's 186,188 provide full wave rectification of the AC board input. Regulation of the charging current, and thus the final battery voltage, is accomplished by controlling the time, or phase angle, at which each of the SCR's 186, 188** is turned on for each cycle.

The SCR's 186, 188 are driven by respective voltage isolating optic couplers 190, 192. With no voltage in the inverter winding **24*a* of the FR transformer 24, the cathodes K of the two SCRs 186, 188 are at the voltage of the positive pole of the battery 50 via the center tap T of the inverter winding 24*a* (see FIG. 2). As the first negative-going half cycle of power appears at the cathode K of the SCR 186, its voltage drops until it reaches the circuit common level. Meanwhile, the voltage on the cathode K of the SCR 188 is equal to the battery voltage plus the positive half cycle of charging voltage; however, the SCR 188** is reverse biased and will not conduct.

A resulting voltage between the cathodes K of the SCRs 186 and 188 causes current to flow through a diode 194, a resistor 196 and diode 198, developing approximately 10 volts across each of the diodes 194, 198. Should the SCR 186 turn on by current through the optic coupler 190, discussed below, the 10 volt potential across the diode 194 is applied across a resistor 200 and the gate of the SCR 186, latching it on. With the SCR 186 latched on, negative charging current passes through both the SCR 186 and a current sensing resistor 202, to circuit common. Current from the positive side of the battery 50 passes into the center tap of the FR transformer 24. At the end of this half-cycle, as current through the SCR 186 reduces to zero, the SCR 186 ceases to conduct and will not again conduct until the next negative half-cycle when the optical coupler 190 is again turned on. For the other half of each cycle, the SCR 188 and its associated optical coupler 192 function in an identical fashion. While LEDs **190*a*, 192*a* of their respective optical couplers 190, 192 are in series and both operate during each half-cycle, only the respective one of the SCRs 186 and 188 whose cathode is driven negative will actually conduct. The diodes 194 and 198 limit the maximum voltage across the optic couplers 190,192** to 10 volts in the forward direction, and to about 0.6 volts in the reverse direction.

Control of the duty-cycle or conduction time of each of the SCRs 186, 188 is accomplished by a conventional method of comparing a sawtooth waveform with a reference via a comparator. The DC level of the sawtooth waveform is shifted to provide the required duty cycle or pulse-width control. The design is such that charging begins at some point into each cycle (delayed turn-on) and ends at the end of each cycle. That is, the "front" of each charging cycle is changed in time or position to control the total charging current. The inductance of the FR transformer 24 provides initial current limiting to "soften" the turn-on current pulse.

To accomplish this duty-cycle control, a transistor 204 is normally biased into conduction, resulting in the collector C of a transistor 206 being high, permitting current to flow through a resistor 208, a diode 210 and a resistor 212, developing a positive voltage at an inverting input of an operational amplifier 214. The operational amplifier 214 functions as a ramp generator. The voltage at the inverting input of the operational amplifier 214 is about +13 volts, significantly higher than the +5 volts reference on the noninverting input of the operational amplifier 214, resulting in a negative swing at the output of the operational amplifier 214. This negative swing rapidly increases until a diode 216 conducts, providing current to offset the current through the diode 210. The output of the operational amplifier 214 reaches a stable steady-state when the voltages at the inverting and non-inverting inputs of the operational amplifier 214 are equal. The voltage at the output of the operational amplifier 214 will be the same amplitude as the reference voltage at the non-inverting input of the operational amplifier 214, minus the voltage drop across the diode 216, or about +5 volts. This voltage corresponds to a reset state of the operational amplifier 214.

The charging AC voltage applied at the cathode K of the SCR 186 via the inverter winding **24*a* causes current to flow through a resistor 217 and diodes 218, 220, 222 during its negative half-cycle, and then through a resistor 224, a diode 226 and the diodes 220, 222 during the other negative half-cycle, i.e., when the transformer charging voltage output has exceeded the present battery voltage during each half-cycle. As a result of this full-wave, negative cycle waveform of about 1.2 volts peak at its base, the transistor 204 will cease to conduct during each half-cycle whenever the board input AC voltage is more than about 1.2 volts negative, corresponding to the voltage drop across the diodes 218, 226 and the diodes 220, 222**. This condition corresponds to the beginning of a charging cycle.

When the transistor 204 stops conducting, the transistor 206 conducts and current flow through the diode 210 ceases, causing the output of the operational amplifier 214 to integrate, or ramp positive, to maintain a constant current through the resistor 212, thus keeping the voltage on the inverting input of the operational amplifier 214 equal to that on the non-inverting input thereof. When the AC input again goes positive for each half-cycle, the operational amplifier 214 is again reset as the transistor 204 conducts. The output of the operational amplifier 214 is thus a 60 Hz ramp waveform which is fed to a non-inverting input of a comparator 230, where the ramp waveform is compared to a 5 volt reference. Each time the ramp voltage exceeds the 5 volt reference, the output of the comparator 230 rapidly swings high, turning on a transistor 232. The resulting current flow through the transistor 232 turns on the LEDs of the optical couplers 190, 192, turning on the respective one of the SCRs 186, 188.

Normally, the duty-cycle or duration of this pulsed current through the LEDs of the optical couplers 190, 192 corresponds to the total time that either AC board input is negative, when charging of the battery 50 can occur, and would represent maximum average charging current. However, as discussed below, whenever either the maximum charging current or the float voltage limit is reached, the DC level input to the non-inverting input of the comparator 230 is pulled down, shifting the ramp waveform downward with regard to the reference input, resulting in a reduced pulse width at the output of the comparator 230, and hence a reduced charging current.

As mentioned above, provided a predetermined time is not exceeded, the battery 50 is charged to a predetermined float voltage. Specifically a 5 volt reference is applied to a non-inverting input of a float volts sense operational amplifier 236. Due to a blocking action of a diode 238 and a high value of a resistor 240, the inverting input of the operational amplifier 236 is at the same voltage as the output thereof. Thus the operational amplifier 236 acts as a non-inverting, unity gain amplifier, with 5 volts at its output. This 5 volt voltage is also fed to the non-inverting input of the comparator 230, and modulates the ramp waveform average level to control the charging duty-cycle.

Meanwhile, the voltage across the battery 50 is applied across a resistor 239, which is in parallel with a temperature compensating thermistor 240. As the battery voltage approaches the correct float level, which in the present embodiment is 54.8 volts @ 25 degrees C, the voltage at the junction of the resistor 239 and a resistor 242 approaches 5 volts, this voltage being the reference voltage plus the voltage drop across a diode 244. The diode 244 provides temperature voltage compensation for the diode 238.

Once the voltage at the junction of the resistor 239 and a resistor 242 exceeds the reference voltage, the diode 238 starts to conduct. Conduction of the diode 238 causes the comparator 236 to function as a high gain, inverting amplifier with a gain of about 45 due to current through resistors 248 and 250. This gain results in a rapid reduction in the DC level of the ramp waveform output of the ramp generator 236, resulting in a reduced charging duty-cycle and corresponding charging current.

To indicate that the battery 50 has reached its float voltage, a comparator 252 senses current flow through the resistor 250, indicating float voltage control is in effect. If the comparator 252 does sense current flow, the output of comparator 252 swings fully high, driving transistor 254 into conduction and thereby turning on a float voltage indicator, 256.

The system also provides current control of the charging duty-cycle, as follows. As referenced above, charging current half-cycles produce a voltage proportional to the charging current across the resistor 202. An integrating operational amplifier 260 integrates this proportional voltage with a time constant determined by a capacitor 262 and a resistor 264. At maximum charging current, the operational amplifier 260 generates a steady output voltage of approximately 5 volts, which is the same as the reference voltage.

A current senses operational amplifier 266 functions similarly to the float volts sensing operational amplifier 236, discussed above. Specifically, the operational amplifier 266 operates normally as a unity gain amplifier, with an output corresponding to the 5 volt reference applied to its non-inverting input. The output of the operational amplifier 266 is applied to the non-inverting input of the comparator 230. However, when the output of the comparator 260 becomes excessive, indicating excessive charging current, a diode 268 conducts and the resulting output of the operational amplifier 266 swings down, reducing the DC level of the ramp waveform output of the ramp generator operational amplifier 214, thereby reducing the charging duty-cycle.

During initial start of the battery charging mode, high charging currents will typically occur until the charge integrating operational amplifier 260 has sufficient time to respond, as determined by the resistor 264, and to adjust its output accordingly. However, an alternate, much shorter, time constant is provided for the charge integrating operational amplifier 260 to quickly increase the output of the charge integrating operational amplifier 260 whenever the voltage across the resistor 202 exceeds about 1.8 volts, the voltage drop across diodes 270, 272, 274, corresponding to about 70 amperes peak charging current.

To indicate that the battery 50 is being charged at the peak level, a comparator 276 operates a current limit indicator 278 by sensing current through a resistor 279, in the same fashion as did the comparator 252 and the display 256, discussed above. The brightness of a battery charging indicator 280 will diminish as the charging current decreases with a fully charged battery 50.

In addition to controlling or limiting both the float voltage and the charging current by controlling the charging duty cycle, a timing circuit is provided to determines if, after a programmable time period of continuous charging, the battery 50 has reached its proper float voltage. As discussed above, the battery 50 is in fact four 12 volt, multi-cell, batteries connected in series. If one or more of the individual batteries, or cells thereof, is bad, it appears as a short, and the total voltage across all four of the batteries will never reach the float voltage. Continued charging would occur to the detriment of the remaining good ones of the batteries.

Accordingly, whenever the system 10 detects loss of utility power and transfers operation to the battery 50, commonly referred to as the standby mode, an inhibit signal (logical low) is generated by logic circuits, discussed below. The inhibit signal appears at a terminal 281 and turns off the LEDs in the optical couplers 190, 192 by grounding the drive signal to the transistor 232 via a diode 282. The inhibit signal also resets charge time counters 283, 284 via a diode 286 and a transistor 288. Once utility power resumes and the system 10 returns to normal operation, re-charging of the battery 50 begins. A comparator 290 functions as a clock oscillator, generating an approximately 1.5 Hz clock signal. This clock signal causes the charge time counters 283, 284 to count up. A capacitor 292 provides an initial power-up reset pulse for the charge time counters 283, 284.

If, before the programmed number of hours of continuous charging, the float voltage has been reached, the high output of the comparator 252 will pull down the clock input of the counter 283 via a diode 294, thus stopping any additional counting of the charge time counters 283, 284.

If the float voltage is not reached, counting continues, and after the programmed time, as selected by jumpers to a resistor 296, the selected output of the charge time counter 284 goes high, turning on transistors 298, 300, 302, thus lighting check battery indicator 304. The high output at the collector of the transistor 300 will also stop the counters 283,284 by pulling the clock signal high through a diode 306. The high output will also shift the current integrator reference at the non-inverting input of the comparator 260 to a higher level by current through resistor 308 and diode 310, which develops a reference voltage across diode 312. This action increases the output of the comparator 260, forcing a reduction in charge current to a trickle level which will maintain any good ones of the batteries, while not damaging them by allowing the otherwise maximum charging current to continue to flow indefinitely.

Should the system go to standby again, the counters 283, 284 would reset and again try to charge the battery 50 for the programmed time before again going into the automatic trickle mode with check battery indication. To provide greater visibility for the status indicating LEDs, the voltage applied to these indicators is pulsed by a 1.5 Hz clock signal, allowing them to flash at a visible rate.

Figure 4A:
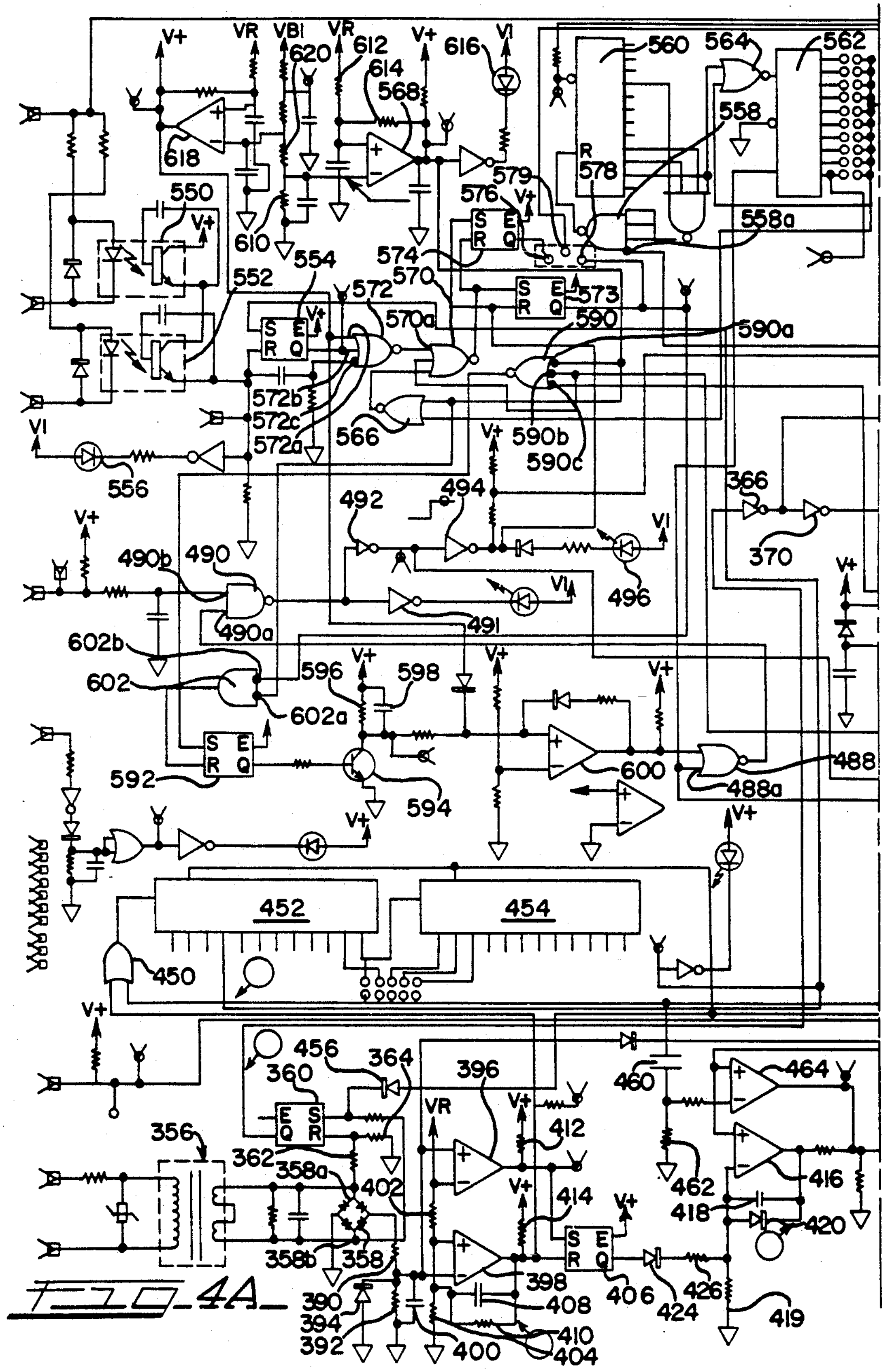
FIG. 4 is a schematic diagram of another portion of the control module of applicants' system.
Figure 4B:
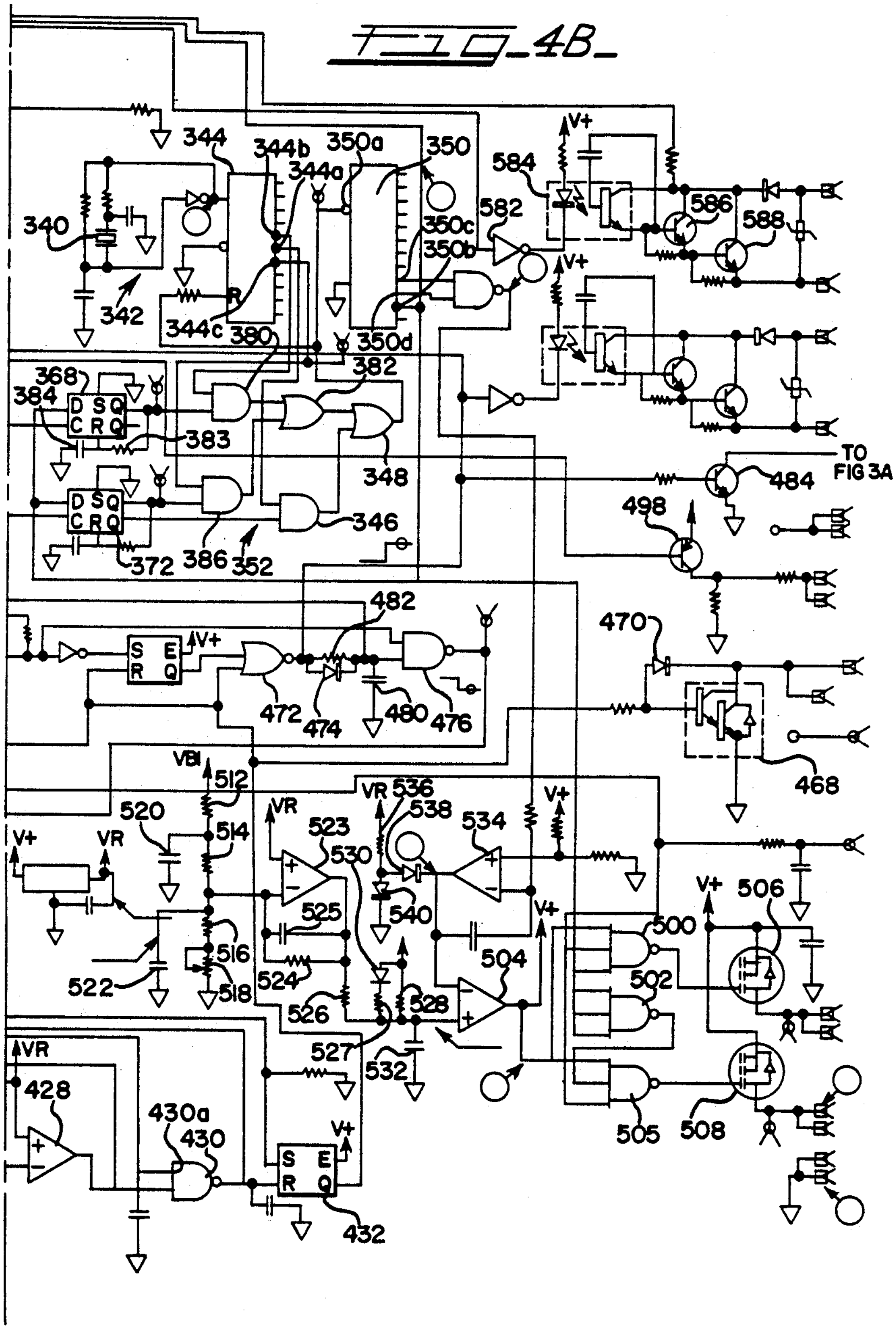

Additional portions of the control module 46 are illustrated in FIG. 4. CMOS devices use +14 volts for VDD source. The reference voltage is 5 VDC+1%.

When the system 10 is in the standby mode and the battery has discharged to a minimum allowable charge, the system 10 provides maximum safety for motorists approaching the intersection. Specifically, power is not removed from the traffic lights until generation of a "uniform code flash command" or UCFC, signal first switches the traffic lights to a flash mode. The traffic lights continue in the flash mode for, at most, a predetermined time period, such as one minute, and then shut down. Generation of the UCFC signal is as follows. A condition, commonly referred to as Phase 2 and Phase 6 Green (herein, PPG) represents conditions in which all traffic lights are red. Hence all traffic should be stopped. The traffic light controller provides the PPG signal. Upon coincidence of a low battery condition and a PPG signal, a UCFC signal flash command is initiated and a one minute timer is started. After one minute, the inverter 48 is shut down and power to the traffic lights ceases. In the event PPG inputs are not connected, or are improperly connected, a latch identifies this condition and bypasses the PPG requirement for shutdown. Instead, the UCFC signal command is initiated upon low battery condition for one minute, then power shutdown occurs.

If the battery 50 is in such poor condition that the battery is discharging faster than the contemplated design rate, indicating that the battery 50 has insufficient power to cause the traffic lights to flash for one minute, an absolute low battery detector shut down will occur.

Once the low battery condition is detected and the one-minute timer is started, the inverter 48 will run only for the next consecutive minute. Even if utility power is restored during the timer operation, at the end of the one minute period the inverter 48 cannot be started again until the battery 50 is recharged.

An external generator (not shown) may be connected to provide power during extended absence of utility power. The battery 50 cannot be recharged from this external generator, since the FR transformer 24, which contains the charger windings, requires accurately controlled AC line frequency and generators typically have poor frequency control.

The output frequency of the inverter 48 is accurate to 0.005%. Specifically, the control module 46 includes a crystal controlled oscillator and divider circuit to provide a 60 Hz inverter drive signal by dividing down from a 2.4576 MHz crystal oscillator. This inverter drive signal maintains the 60 Hz output frequency during inverter operation. A 2.4576 MHz crystal 340, used in conjunction with an oscillator circuit, generally designated 342, generates a very stable clocking signal input to a decimal counter 344. The decimal counter 344 includes a "divide by 5" output 344*a* of 491.52 KHz which is passed by an-AND gate 346 and an OR gate 348 to a clock input 350*a* of another binary counter 350. The binary counter 350 includes an output 350*b* which generates a square wave comprising the 60 Hz inverter drive signal.

The control module 46 further includes phase locking circuits, generally designated 352, which provides digital synchronization of the 60 Hz inverter drive signal with the 60 Hz utility line frequency, both during normal utility operation and again upon re-occurrence of utility power after a power outage. This digital synchronization insures that when there is a power outage, the inverter 48 will immediately start in-phase with residual line power in the FR transformer 24. Upon reconnection of the utility power, the inverter 48 is slowly pulled back into phase with the reconnected line frequency of the utility power for a smooth transition back to utility power operation.

Specifically, the decimal counter 344 includes an output 344*b* which generates a 614.4 KHz square wave, and an output 344*c* which generates a 409.60 KHz. square wave, as compared to the 491.52 KHz signal generated at the divide by five output 344*a*. Digital adjustment of the phase of the 60 Hz inverter drive signal is accomplished by alternately momentarily selecting the 614.40 KHz output 344*b* to slightly increase the 60 Hz output frequency to shift its phase ahead, or, by selecting the 409.60 KHz output 344*c* to slightly decrease the 60 Hz output frequency to shift its phase behind. These phase adjustments are made to return the 60 Hz inverter drive signal output of the binary counter 350 back into phase with the utility line. The selected correction frequency, 344*b* or 344*c*, occurs only briefly during each cycle of the output of the counter 350, in order to perform a smooth and slow phase shift.

Frequency correction is as follows. A line operated transformer 356 provides a 28 VAC utility line reference, which is fed to input terminal 358*a,b* of a bridge rectifier 358. Alternate half-cycles at the input terminals 358*a,b* of the rectifier bridge 358 toggle an SR flip-flop 360. Normally, the output of the SR flip-flop 360 would be a square wave, with equal high time portions and low time portions. However, resistors 362, 364 form a voltage divider, producing lower amplitude signals at the R input of the SR flip-flop 360 than at the S input thereof. Thus the high time duration of the output of the SR flip-flop 360 is longer than the low time duration. As discussed below, this provides additional stability.

The 60 Hz waveform at the output of the SR flip-flop 360 has its waveform more squared by an inverting amplifier 366, and this square wave is applied to a clock input C of a D flip-flop 368. Inverting amplifier 370 inverts the output of the inverting amplifier 366 and similarly applies the signal to a clock input of another D flip-flop, 372. The data, or D, inputs to the two D flip-flops 368, 372 are tied together and to the 60 Hz inverter drive signal output of the counter 350. The D flip-flops 368,372 operate to compare the phase of the 60 Hz inverter drive signal with the phase of the utility line frequency.

The D flip-flops 368, 372, clock in the level of the respective signal at their respective D inputs on the leading edge of the clock inputs. Thus when the clock signal at the clock input of the D flip-flop 368 goes high, its Q output will go high, so long as its D-input, which is the 60 Hz output of the counter 350, is also high, indicating the output phase of the counter 350 is leading the clock signal at the clock input of the D flip-flop 368.

A high value at the Q output of the D flip-flop 368 then enables an AND gate 380, allowing the lower frequency output 344*c* of the counter 344 to pass through an OR gate 382, and then the OR gate 348 to the counter 350 and to the reset R of counter 344.

Additionally, the high value at the Q output of the D flip-flop 368 also initiates an increase of the voltage on the reset R of the D flip-flop 368, delayed by a time constant determined by a resistor 383 and a capacitor 384. After this delay, the D flip-flop 368 is reset, disabling the AND gate 380. Thus the lower frequency clock input of the counter 350 occurs only briefly for each out of phase cycle output of the counter 350, resulting in slowly pulling the output phase of the counter 350 into phase with the signal at the inverting amplifier 370, representative of the phase of the utility power.

For the remainder of each cycle, or when the utility power is in phase with the inverter drive signal, the inverter drive signal at the output 344*a* of the counter 344 is passed by the AND gate 346, which is enabled by a normally high Not-Q output of the D flip-flop 372, and through the OR. gate 348 to the counter 350.

For conditions where the phase output of the inverter drive signal lags the phase of the utility power, the D flip-flop 372 is triggered by the falling edge of the signal, inverted by the inverting amplifier 370, and the higher frequency of the output 344*b* of the counter 344 is enabled by an AND gate 386 and the OR gates 382, 348. At the same time, the output 344*a* of the counter 344 is prevented from prematurely clocking the system by inhibiting the AND gate 346.

In order to prevent instability or excessive jitter in this digital frequency phasing system, the signal at the input to the inverting amplifier 366 is not symmetrical, due to the non-symmetrical output of the SR flip-flop 360, discussed above. This non-symmetrical output allows the signal to "straddle" the signal output of the counter 350, resulting in stable operation. Also, the reset time constants for the D flip-flops 368, 372 differ slightly so that phase correction is faster in one direction than the other, again to improve stability.

During normal utility mode operation, the inverter 48 is inoperative; however, the crystal oscillator 340 and associated phase locking circuits continue to function so that at the instant of a brown-out or other power failure, the inverter 48 will start in phase with the last utility power cycle. During reapplication of utility power, a restart delay occurs to (1) allow the phase locking circuits to re-sync with the reapplied utility power, and (2) to insure that the power is stable for a programmable length of time, as discussed below.

The system further includes a power outage and brown-out detector which detects a low line voltage from the utility or a failure within ¼ cycle of the utility power. The power outage and brown-out detector activates the inverter 48 for standby operation.

As previously discussed, the voltage and phase of the utility power is represented by the output of the transformer 356. The bridge rectifier 358 provides a 120 Hz rectified output, which is attenuated by resistors 390, 392. A regulating diode 394 limits the voltage across the resistor 392 to prevent over driving open collector comparators 396, 398. A capacitor 400 provides additional filtering.

At the end of each cycle of the utility power, the voltage will go to zero. A +5 VDC reference voltage, Vr, is attenuated by resistors 402, 404 to a low value at the non-inverting input of the comparator 398, so that the output of the comparator 398 will go high at the end of each half of the utility power cycle, acting as a zero crossing detector and resetting an SR flip-flop 406. A capacitor 408 provides noise filtering, and a resistor 410 provides hysteresis for the comparator 398. Resistors 412 and 414 function as open collector pull-up resistors.

If, however, during the peak of each cycle of the utility power, the utility voltage has exceeded a predetermined brown-out level, the voltage on the non-inverting input of the comparator 396 will exceed the reference voltage on the inverting input of the comparator 396, causing the output thereof to go high, setting the SR flip-flop 406. Thus, during normal utility voltage levels, the output of the comparator 396 will be a 120 Hz rectangular waveform which repetitively sets the SR flip-flop 406.

An operational amplifier 416 functions as a ramp generator, with a +5 volts reference applied to its non-inverting input. A capacitor 418 and a resistor 419 form an integrating network to produce a positive-going ramp at the output of the operational amplifier 416. This positive going-ramp would normally try to increase indefinitely, but each positive output of the SR flip-flop 406, indicating that the utility line voltage has exceeded the predetermined brown-out level, producing a hard voltage across the resistor 419. This voltage across the resistor 419 causes the output of the operational amplifier 416 to reset, discharging the capacitor 418 through a diode 420. When the output of the comparator 416 reaches a voltage level equal to the reference input minus the drop across the diode 420, it clamps or resets at this level, until the next utility cycle.

If the brown-out level is never reached, the output of the comparator 416 will continue to ramp up, until the attenuated input at the inverting input of a comparator 428 exceeds the reference at the non-inverting input thereof, whereupon the output of the comparator 428 will go low, indicating a brown-out or power failure. This low output of the comparator 428 causes the output of a NAND gate 430 to go high, resetting an AC valid flip-flop 432, resulting in a low level on its Q output.

Upon detection of resumption of utility power, the system 10 further provides a programmable restart delay before turning off the inverter 48 and resuming utility operation to insure that the utility power is stable.

According to the restart delay, a 120 Hz line signal at the reset terminal R of the SR flip-flop 406 is also fed to an OR gate 450, which clocks a binary counter 452, which is followed by an identical counter 454. A programmed delay time is selected by a counter jumper connected to an output of either of the binary counters 452, 454. When the selected jumpered output goes high, between 8 and 128 seconds, the other input to the OR gate 450 stops additional counting, initiates a transfer delay, discussed below, and sets the SR flip-flop 432 to initialize a return to normal line operation, as indicated by a high output at the Q output terminal thereof.

However, if at any time during the restart delay, one or more half-cycles fall below the brown-out level, the output of the NAND gate 430 will go momentarily high, resetting the counters 452, 454. Thus only a full, programmed restart delay time can initialize a return to normal utility operation.

By manually driving input terminal 430*a* of the NAND gate 430 low, one can manually select standby operation, as for testing purposes. With this forced low on the input terminal 430*a* of the NAND gate 430, its high output will hold the restart delay counters 452, 454 in the reset mode, and, via a diode 456, hold the SR flip-flop 360 reset, thus eliminating the utility 60 Hz reference to the phase locking circuits, discussed above. This insures non-synchronized operation of the inverter, simulating a true standby condition for testing.

As a result of the inductance of the FR transformer 24, there is a large inrush current when ultimately reconnecting the system 10 to the utility line 12. If the utility line 12 has a relatively large impedance, this inrush current will result in a short term voltage drop, which otherwise could appear to the system 10 as a utility brown out, initiating the above brown out detector circuitry. Accordingly, the system 10 provides a transfer delay upon transfer to utility operation which prevents operation of the above power outage/brown-out detector for approximately 50 milliseconds upon reapplication of utility power to the FR transformer 24, to compensate for any momentary low line voltage during initial transformer inrush currents.

The transfer delay is implemented by the counters 452 and 454. Specifically, at the end of the restart delay, discussed above and as programmed by the position of the counter jumper at the outputs of the counters 452, 454, the selected output of the counters 452,454 pulls the top end of a capacitor 460 high, causing current to flow through a resistor 462. This current flow simultaneously closes the transformer disconnect relay 40 (FIG. 1), producing the high inrush current.

when the capacitor 460 first goes high, the output of a comparator 464 is momentarily driven low. The capacitor 460 then charges, preventing output from the ramp generator 416 from toggling the comparator 464 back into the standby mode. This hold-off action lasts only about 50 milliseconds, as determined by the values of the resistor 462 and the capacitor 460. However, this transfer delay is long enough for the inrush currents to subside, whereupon normal brown-out detection is reinstated.

The system further includes a line disconnect relay drive which operates the transformer primary relay 18 (FIG. 1) to disconnect the FR transformer 24 from the utility line 12 during inverter operation to prevent feeding power back into the utility lines 12. Specifically, a Darlington transistor 468 provides current to maintain the normally open primary relay 18 closed. When the Q output of the SR flip-flop 432 goes low, indicating a brown-out or power failure, discussed above, drive current for the transistor 468 is removed, shutting off the transistor 468 and permitting the primary relay 18 to open in preparation for turning on the inverter 48 and commencing standby operation. A zener diode 470 provides protection for the transistor 468 by momentarily turning the transistor 468 back on to absorb any voltage spike generated by the coil of the primary relay 18.

Additionally, the low Q output of the SR flip-flop 432, via a NOR gate 472 and a diode 474, produces a low level at the output of a NAND gate 476, indicating a standby situation, which activates an number of circuits in the standby mode, as discussed below.

An inverter overlap relay is provided which momentarily delays shut-off of the inverter 48 upon re-application of utility power to allow time for the primary relay 18 to fully re-close, thus preventing any disturbance in the output voltage. Specifically, whenever utility power has been restored and the transfer delay time, discussed above, has expired, the primary relay 18 will be re-closed to resume normal operation from utility power. However, due to the finite closure time required by the primary relay 18, operation of the inverter 48 continues long enough to insure that its operation slightly overlaps reapplication of utility power to the FR transformer 24, thus insuring no interruptions in transformer output power.

The inverter overlap relay function is accomplished by a capacitor 480 and a resistor 482, which maintain a high, standby, signal condition on the NAND gate 476 for a brief period while the capacitor 480 discharges back through the resistor 482 to the low output terminal of the NOR gate 472.

An inhibit charger disables the battery charger circuitry when the system 10 is in the standby mode. This is accomplished by the high, standby, level on the output of the NOR gate 472 which turns on a transistor 484, thus generating the inhibit signal, discussed above, inhibiting all charger functions.

An enable standby logic operation performs various operations to turn on the inverter 48 and operate respective status LEDs. Accordingly, initialization of the standby mode of operation continues with a low level at the output of the NAND gate 476, which is inverted by a NOR gate 488 and the resulting high level is applied to an input 490*a* of a NAND gate 490. Normally, the level at the other input 490*b* of the NAND gate 490 is high. This high level at the inputs 490*a,b* of the NAND gate 490 results in a low output of the NAND gate 490, which will cause the output of inverting amplifier 491 to go high. This standby condition can be inhibited by a remote low input to the input 490*b* of the NAND gate 490, which forces the output of the NAND gate 490 to a high level.

Additionally, the output of the NAND gate 490 is inverted again by an inverting amplifier 492 to produce a high level which performs a number of functions.

First, the output of the inverting amplifier 492 is again inverted by an inverting amplifier 494 to turn on a standby LED, 496. The output of the inverting amplifier 494 also causes current flow to turn on a transistor 498, which enables the snubber SCRs 74,83 via SCR drive line 499 (see FIG. 2).

Additionally, the high output of the inverting amplifier 492 enables NAND gates 500, 502. The NAND gates 500, 502 NAND the high level of the inverting amplifier 492 with the 60 Hz inverter drive signal from the output 350B of the counter 350, and the resulting high output from a comparator 504 and a NAND gate 505 of the duty cycle adjust circuit, discussed below, to operate power module drivers 506, 508. A NAND gate 502 simply inverts the 60 Hz inverter drive signal so that the drive signals for the power transistors 60,62 of the inverter 48 are 180 degrees out of phase.

The system 10 additionally includes duty cycle adjust circuitry which adjusts the duty cycle of the inverter 48, to maintain a constant AC output voltage from the FR transformer 24 as the battery 50 discharges. Accordingly, the battery voltage is sensed via a voltage divider string comprising resistors 512, 514, 516 and 518, with capacitors 520 and 522 acting as noise filters. Approximately 5 volts appears at the junction of the resistors 514 and 516, which is applied to an inverting input of an operational amplifier 523. The operational amplifier 523 provides a gain proportional to the resistance of a resistor 524, filtered by a capacitor 525, and offset by a 5 VDC reference applied to a non-inverting input of the inverting amplifier 523. The output of the operational amplifier 523 is therefore a voltage that varies linearly with the battery voltage.

Due to the non-linearly of the system, the duty cycle modulation of the drive signal to the inverter 48 must also vary in a non-linear fashion. This is accomplished by resistors 526, 527, 528 and diode 530, with a capacitor 532 functioning as a noise filter, to produce a non-linear representation of the battery voltage at the non-inverting input of the comparator 504.

As discussed above, the output 350*b* of the counter 350 generates a square wave comprising the 60 Hz inverter drive signal. The counter 350 further includes terminals 350*c* and 350*d* which produce negative going pulses that are narrower than each half of the 60 Hz inverter drive signal and that end at the transition of each half-cycle output of the inverter drive signal. These negative going pulses are integrated by an operational amplifier 534, to produce a positive-going triangular waveform at the output thereof. A resistor 536 and diodes 538 and 540 insure that the base reference point of this triangular waveform is always at circuit common. The peaks of this triangular waveform occur at each transition point in the 60 Hz inverter drive signal input to the NAND gates 500, 502. By comparing this fixed triangular waveform with the varying battery proportional voltage at the comparator 504, the output of the comparator 504 is a pulse whose width is a function of the battery voltage. Variations in the width of the pulse occur both at the start and end of the pulse, so that it remains centered within each half cycle of the 60 Hz inverter drive signal. This modulated width pulse then forms the ultimate gating of the NAND gates 500,505, to control the width of the drive pulses to the power module drivers 506, 508.

As discussed above, the controller will switch from its normal mode of operation to a flashing mode of operation upon receipt of a UCFC signal. Absent certain conditions, such as the absence of a PPG signal, the system 10 does not permit the controller to switch to a flashing mode at any random time. Rather, the system 10 waits until a PPG condition exists, in which all traffic is stopped.

Accordingly, the system 10 generates low battery and absolute low battery cutoff signals indicating an impending low battery condition. The system 10 further provides flash command logic which processes the low battery and absolute low battery cutoff signals and the PPG signal inputs to provide the programmed delay before issuing the UCFC signal back to the controller during standby operation.

The UCFC signal will be issued to the controller under one of three following conditions, as determined by programming of the control module 46.

According to a first mode, if the system 10 has been programmed to issue the UCFC signal as soon as the system goes to standby, then the system 10 switches to standby and then waits for the first occurrence of PPG signal. The system 10 then issues the UCFC signal and continues to operate in the flash mode, via battery power, until shutdown is caused by a low battery condition or until utility power is restored, whichever occurs first.

According to a second mode, the system 10 will operate in the normal traffic light mode for a programmed delay time. After the programmed delay, the system 10 will then switch to the flash mode upon detection of the first occurrence of a PPG signal. The system 10 will continue to operate in the flash mode in standby until shutdown is caused by a low battery condition, or until utility power is restored.

According to a third mode, the system will operate continuously in the normal traffic light mode but, if the low battery condition has occurred, the UCFC signal is issued upon first occurrence of the PPG signal, and operation will continue in the flash mode for one minute before the system will shut down, unless utility power is first restored.

If the Phase 2 and Phase 6 inputs from the controller are not wired or ar non-functional, the UCFC signals will be issued as described above, but without benefit of coincidence with PPG signal. For example, in the first mode above, the UCFC signal will be issued immediately upon going to the standby mode.

Shutdown of the system 10, before return of utility power, will occur if a low battery level is reached during operation in the standby mode. The system 10 will continue to operate for one minute after detecting the low battery condition to allow a one minute period of flash operation before it shuts down. If, for any reason, a second and lower battery condition is reached, referred to as an absolute low battery condition, the system 10 will be shut down immediately.

In accordance with the above, PPG true signals from the traffic controller (not shown) are optically isolated by optical isolators 550, 552. Outputs from the optical isolators 550, 552 are wired in series to form an AND function.

An SR flip-flop 554 is set by the delay counter 452, each time the utility power resumes and the restart delay beings. In this condition, the high Q output of the flip-flop 554 indicates an absence of a PPG signal.

However, if a PPG signal occurs, the resulting high output of the optical isolator 552 will reset the flip-flop 554, as well as illuminate a PPG indicator 556. Thus the flip-flop 554 determines if the PPG signal has been connected to the system 10 and is active.

As soon as the system goes into standby operation, a high level is applied at an input 558*a* of a NAND gate 558, which will enable the NAND gate 558, causing a low at its output and releasing the reset for a binary counter, 560. The counter 560 is clocked by the 60 Hz inverter drive signal, and cyclically resets itself every 2 minutes to produce a two minute clock input to a counter 562.

When the programmed count of the counter 562 is reached, indicating the delay until flash time has expired, the counter 562 disables any additional clock via a NOR gate 564, and also causes a low output at a NOR gate 566. Additionally, a low output from the NOR gate 566 can be caused by a low battery condition, resulting in a high output from a comparator 568. The output of a NOR gate 570 can now go high to initiate a flash command if there is no utility power applied and the restart delay is not in progress.

The output of a NOR gate 572 will go low if, (1) there is a high input, indicating an absolute low battery condition, to a terminal 572A of the NOR gate 572, or (2) there is a high input at a terminal 572B of a NOR gate 572, indicating no detection of a PPG signal, or, lastly, (3) if the PPG signal at an input terminal 572C of the NOR gate 572 pulses high, as coupled from the optical isolators 550, 552.

In the last condition above, wherein an output occurs from the optical isolators 550, 552, the UCFC signal will occur coincidentally with the PPG signal. Otherwise, it will be just a flash command.

In either condition, the UCFC signal, comprising a high output of the NOR gate 570, will toggle a pair of flip-flops 573, 574, so that the output Q of the flip-flop 574 will be low and the output of the flip-flop 573 will be high, thus providing either true high or true low selectable signals at outputs 576 and 578 for connection to pin 579. The flip-flop pair 573, 574 was initially set by the standby signal from the inverting amplifier 494, which also drives the standby indicator 496.

The selected level at the pin 579 then respectively enables or disables an inverting amplifier 582, respectively operating a flash command optical coupler 584. Output from the flash command optical coupler 584 is current amplified by a Darlington pair comprising transistors 586, 588.

A NOR gate 590 operates as a reset source for the one minute timer. When the system initially goes to standby, one terminal 590*a* of the NOR gate 590, representing the lower battery voltage, and another terminal 590*b*, representing AC valid, will both be low, i.e., false. A third terminal 590*c* of the NOR garb 590 will also be momentarily low while the capacitor 480 charges, resulting in a high output from the NOR gate 590. This high output will return to a low level as soon as the capacitor 480 is charged and the inverter 48 is started. However, the short positive output of the NOR gate 590 will set a flip-flop 592, the one minute timer controller.

With the flip-flop 592 set, its Q output will be high, turning on a transistor 594, causing current flow through a resistor 596 and developing a corresponding voltage across a capacitor 598. The capacitor 598 will charge rapidly, placing a low level on a non-inverting input of a comparator 600. The low level on the non-inverting input of the comparator 600 results in a low level at the output thereof. As a result of the low output from of the comparator 600, the NOR gate 488 is disabled, causing the output of the NOR gate 488 to go high, indicating the standby mode of operation, if an other input 488*a* of the NOR gate 488 also goes low.

However, if an input terminal 602*a* of an AND gate 602 is high, indicating a low battery condition, and another input terminal 602*b* of the AND gate 602 is high, indicating the flash command has been sent, then the output of the AND gate 602 will also go high, resetting the flip-flop 592. As a result, the Q output of the flip-flop 592 will go low, turning off the transistor 594.

With the transistor 594 turned off, the non-inverting input of the comparator 600 initially remains low because of the charge on the capacitor 598. However, as the capacitor 598 discharges, the comparator 600 will toggle when the voltage on its non-inverting input goes above the reference voltage on its inverting input, with the output of the comparator 600 swinging high, enabling the NOR gate 488 and turning off the inverter 48.

Once the inverter 48 has been turned off by this low battery condition, the flip-flop 592 cannot be reset, and thus the inverter 48 cannot be re-started, unless the following conditions occur: (1) the inverter 48 is off (input 590*c* of the NOR gate 590 is low); (2) the low battery condition is false (input 590B of the NOR gate 590 is low); and (3) there has been another power failure (input 590B of the NOR gate 590 is low). The one minute timer will then be reset, recharging the capacitor 598.

As discussed above, the system 10 provides a low battery signal and an absolute battery cutoff signal. The low battery signal signals the system 10 of an impending low battery condition, and the absolute battery cutoff signal provides a forced shut down.

With respect to the low battery signal, the low battery comparator 568 compares the battery voltage, developed across resistor 610 with a reference voltage through a resistor 612. A resistor 614 provides hysteresis to insure stable output of the comparator 568.

If the battery voltage is below the minimum level, the output of the comparator 568 will be high, and the low battery indicator 616 will be turned on.

An absolute low battery comparator 618 operates in a similar fashion, but with a slightly different input level representing the battery voltage, due to a resistor 620. The output of the comparator 618 is also coupled to the comparator 600 to immediately shut down the inverter 48 should absolute low battery occur at any time, including during operation of the one minute time.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

We claim:

1. In a device for generating a first alternating signal having a desired frequency, a circuit for adjusting a phase angle of said first alternating signal to equal a phase angle of a second alternating signal, the device comprising:

means for generating said first alternating signal, said generating means having an input, said frequency of said first alternating signal being dependent upon a characteristic of a control signal applied to said input;

means for providing first, second and third control signals, said first control signal having a characteristic to cause said first generating means to generate said first alternating signal at said desired frequency, said second control signal having a characteristic to cause said first generating means to generate said first alternating signal at a frequency above said desired frequency, and said third control signal having a characteristic to cause said first generating means to generate said first alternating signal at a frequency below said desired frequency;

means for comparing said phase angle of said first alternating signal to said phase angle of said second alternating signal; and means responsive to said comparing means for selectively coupling one of said first, second or third control signals to said input to adjust said phase angle of said first alternating signal to equal said phase angle of said second alternating signal.

2. The device of claim 1 wherein said first signal generating means comprises a counter.

3. In a device for generating a first alternating signal having a desired frequency, a circuit for adjusting a phase angle of said first alternating signal to equal a phase angle of a second alternating signal, the device comprising:

a counter for generating said first alternating signal, said counter having an input, said desired frequency of said first alternating signal being dependent upon a frequency of a control signal applied to said input;

means for providing first, second and third control signals, said first control signal having a frequency to cause said first generating means to generate said first alternating signal at said desired frequency, said second control signal having a frequency to cause said first generating means to generate said first alternating signal at a frequency above said desired frequency, and said third control signal having a frequency to cause said first generating means to generate said first alternating signal at a frequency below said desired frequency;

means for comparing said phase angle of said first alternating signal to said phase angle of said second alternating signal; and means responsive to said comparing means for selectively coupling said first control signal to said input if said phase angle of said first alternating signal equal said phase angle of said second alternating signal, coupling said second control signal to said input if the phase angle of said first alternating signal lags said phase angle of said second alternating signal, and coupling said third control signal to said input if the phase angle of said first alternating signal leads said phase angle of said second alternating signal.

4. A device for generating a first alternating signal in phase with a second alternating signal, each of said first and second alternating signals having a phase angle, said device comprising:

an input, said phase angle of said first alternating signal being responsive to a signal coupled to said input;

means for generating a primary alternating signal, an upper alternating signal and a lower alternating signal, said primary alternating signal having a frequency, said upper alternating signal having a frequency greater than said frequency of said primary alternating signal and said lower alternating signal having a frequency less than said frequency of said primary alternating signal;

means for comparing said phase angle of said first alternating signal with said phase angle of said second alternating signal;

means for selectively coupling one of said primary, upper or lower alternating signals to said input, said selectively coupling means coupling said primary alternating signal to the input when said phase angle of said first alternating signal equals said phase angle of said second alternating signal, coupling said upper alternating signal when said phase angle of said first alternating signal lags said phase angle of said second alternating signal and coupling said lower alternating signal when said phase angle of said first alternating signal leads said phase angle of said second alternating signal; and means responsive to said coupling means for adjusting said phase angle of said first alternating signal.

* * * * *